(12) United States Patent
Rehder et al.

(10) Patent No.: US 7,566,948 B2
(45) Date of Patent: Jul. 28, 2009

(54) BIPOLAR TRANSISTOR WITH ENHANCED BASE TRANSPORT

(75) Inventors: Eric M. Rehder, Providence, RI (US); Roger E. Welser, Providence, RI (US); Charles R. Lutz, Seekonk, MA (US)

(73) Assignee: Kopin Corporation, Taunton, MA (US)

( * ) Notice: Subject to any disclaimer, the term of this patent is extended or adjusted under 35 U.S.C. 154(b) by 613 days.

(21) Appl. No.: 10/969,762

(22) Filed: Oct. 20, 2004

(65) Prior Publication Data

US 2006/0081963 A1    Apr. 20, 2006

(51) Int. Cl.
*H01L 29/732* (2006.01)
(52) U.S. Cl. .............................. 257/592; 257/E27.055
(58) Field of Classification Search ................ 257/191, 257/197, 198, 592, E29.188, E29.189, E29.19, 257/593, E27.053, E27.055
See application file for complete search history.

(56) References Cited

U.S. PATENT DOCUMENTS

| | | | |
|---|---|---|---|
| 4,518,979 | A | 5/1985 | Dumke et al. |
| 5,371,389 | A | 12/1994 | Matsuno et al. |
| 5,429,957 | A | 7/1995 | Matsuno et al. |
| 5,448,087 | A * | 9/1995 | Streit et al. .................. 257/198 |
| 5,571,732 | A | 11/1996 | Liu |
| 5,606,185 | A * | 2/1997 | Nguyen et al. ............... 257/197 |
| 5,814,843 | A | 9/1998 | Ohkubo |
| 5,858,818 | A | 1/1999 | Ro et al. |
| 5,903,018 | A | 5/1999 | Shimawaki |
| 6,031,256 | A | 2/2000 | Liu et al. |
| 6,150,667 | A | 11/2000 | Ishizaka et al. |
| 6,150,677 | A | 11/2000 | Tanaka et al. |
| 6,285,044 | B1 | 9/2001 | Bhat |
| 6,570,241 | B2 * | 5/2003 | Hashimoto .................. 257/592 |
| 6,765,242 | B1 * | 7/2004 | Chang et al. ................ 257/197 |
| 6,847,060 | B2 | 1/2005 | Welser et al. |

(Continued)

FOREIGN PATENT DOCUMENTS

FR    2 795 871 A1    1/2001

(Continued)

OTHER PUBLICATIONS

Chang, et al., "InGaAsN/AlGaAs P-n-p heterojunction bipolar transistor," *Applied Physics Letters*, 79(19):2788-2790 (2000).

(Continued)

*Primary Examiner*—Allan R. Wilson
(74) *Attorney, Agent, or Firm*—Hamilton, Brook, Smith & Reynolds, P.C.

(57) ABSTRACT

A bipolar transistor includes a base layer design and a method for fabricating such a bipolar transistor that employ a built-in accelerating field focused on a base region adjacent to a collector, where minority carrier transport is otherwise retarded. The accelerating field of the base layer includes on average, a relatively low p-doping level in a first region proximate to the collector and a relatively high p-doping level in a second region proximate to an emitter. Alternatively, the accelerating field can be derived from band gap grading, wherein the grade of band gap in the first region is greater than the grade of band gap in the second region, and the average band gap of the first region is lower than that of the second region.

34 Claims, 11 Drawing Sheets

U.S. PATENT DOCUMENTS

| | | | |
|---|---|---|---|
| 2001/0040244 A1 | 11/2001 | Fitzgerald et al. | |
| 2002/0027232 A1 | 3/2002 | Shigematsu et al. | |
| 2002/0102847 A1 | 8/2002 | Sharps et al. | |
| 2002/0163014 A1* | 11/2002 | Welser et al. | 257/197 |
| 2002/0185656 A1* | 12/2002 | Aoki | 257/197 |
| 2005/0020033 A1 | 1/2005 | Specht et al. | |

FOREIGN PATENT DOCUMENTS

| | | |
|---|---|---|
| JP | 11312685 | 11/1999 |
| WO | WO 01/03194 A1 | 1/2001 |
| WO | WO 02/43155 A2 | 5/2002 |

OTHER PUBLICATIONS

Welser, et al., "Low $V_{be}$ GaInAsN Base Heterojunction Bipolar Transistors," *IEICE Trans. Electron.*, E84-C(10): 1389-1393 (2001).

Li, et al., "DC characteristics of MOVPE-grown Npn InGaP/InGaAsN DHBTs," *Electronics Letters*, 36(1): 81-83 (2000).

Kohama, et al., "Using Carbon Tetrachloride for Carbon Doping $Al_xGa_{1-x}$ As Grown by Metalorganic Chemical Vapor Deposition," *Jpn. J. Appl. Phys.*, 34(7A): 3504-3505 (1995).

Sugiura, et al., "Characterization of heavily carbon-doped InGaAsP layers grown by chemical beam epitaxy using tetrabromide," *Applied Physics Letters*, 73(12):2482-2484 (1998).

Bhat, et al., "Growth of GaAsN/GaAs, GaInAsN/GaAs and GaInAsN/GaAs quantum wells by low-pressure organometallic chemical vapor deposition," *Journal of Crystal Growth*, 195: 427-437 (1998).

Chang, et al., "InGaP/InGaAsN/GaAs NpN double-heterojunction bipolar transistor," *Applied Physics Letters*, 76(16):2262-2264 (2000).

Welser, R.E., et al., "Role of Neutral Base Recombination in High Gain AlGaAs/GaAs HBT's," *IEEE Transactions on Electron Devices*, 46(8):1599-1607(1999).

Ahmari, D.A., et al., "High-speed InGaP/GaAs HBT's with a Strained $In_xGa_{1-x}$As Base," *IEEE Electron Device Letters*, 17(5):226-228(1996).

Welser, R.E., et al., "Turn-on Voltage Investigation of GaAs-Based Bipolar Transistors with $Ga_{1-x}In_xAs_{1-y}N_y$ Base Layers," *IEEE Electron Device Letters*, 21(12):1-4(2000).

Low, T., et al., "InGaP HBT technology for RF and microwave instrumentation," *Solid-State Electronics*, 43:1437-1444(1999).

Liu, W., et al., "Current Transport Mechanism in GaInP/GaAs Heterojunction Bipolar Transistors," *IEEE Transactions on Electron Devices*, 40(8):1378-1383(1993).

Lu, Z.H., et al., "Determination of band gap narrowing and hole density for heavily C-doped GaAs by photoluminescence," *Appl. Phys. Lett.*, 64(1): 88-90(1994).

Welser, R.E., et al., "High Performance $Al_{0.35}Ga_{0.65}As/GaAs$ HBT's," *IEEE Electron Device Letters*, 21(5):196-199(2000).

Welser, R.E., et al., "Base Current Investigation of the Long-Term Reliability of GaAs-Based HBTs," *GaAs Mantech*, (2000).

Patton, G.L., et al. "Graded-SiGe-Base, Poly-Emitter Heterojunction Bipolar Transistors," *IEEE Electron Device Letters*, 10(12):534-536(1989).

Ida, M., et al., "InP/InGaAs DHBTs with 341-Ghz $f_T$ at high current density of over 800 kA/$cm^2$," *IEEE*, (2001).

Kroemer, H., "Heterostructure bipolar transistors: What should we build?" *J. Vac. Sci. Technol.*, B1(2):126-130(1983).

Fujihara, A., et al., "High-speed InP/InGaAs DHBTs with Ballistic Collector Launcher Structure," *IEEE*, (2001).

Nakahara, K., et al., "Continuous-wave operation of long-wavelength GaInNAs/GaAs quantum well laser," *Electronic Letters*, 32(17): 1585-1586(1996).

Mochizuki, K., et al., "GaInP/GaAs Collector-Up Tunneling-Collector Heterojunction Bipolar Transistors (C-Up TC-HBTs): Optimization of Fabrication Process and Epitaxial Layer Structure for High-Efficiency High-Power Amplifiers," *Transactions on Electron Devices*, 47(12):2277-2283(2000).

Pan N., et al., "Pseudomorphic In-Graded Carbon Doped GaAs Base Heterojunction Bipolar Transistors by Metal Organic Chemical Vapor Deposition," *Journal of Electronic Materials*, 25(7):13 (1996).

Ohkubo, M., et al., "Compositionally Graded C-doped $In_{1-x}Ga_xAs$ Base in InP/InGaAs D-HBTs Grown by MOCVD with Low Sheet Resistance and High Current Gain", *IEEE*, pp. 641-644, 1997.

Stockman, S. A., et al., "Carbon Doping of $In_xGa_{1-x}As$ By MOCVD Using $CCl_4$", pp. 40-43, no date given.

Keiper, D., et al., "Metalorganic Vapour Phase Epitaxy Growth of InP-based Heterojunction Bipolar Transistors with Carbon Doped InGaAs Base Using Tertiarybutylarsine and Tertiarybutylphosphine in $N_2$ Ambient", XP-001030248, *Jpn. J. Appl. Phys.*, vol. 39:6162-6165 (2000).

Stillman, G. E., et al., "Carbon-doped InGaAs grown by MOCVD for InP/InGaAs heterojunction bipolar transistors", *Inst. Phys. Conf. Ser. No. 129*:687-692 (1992).

Kroemer, H., "Two Integral Relations Pertaining to the Electron Transport Through a Bipolar Transistor With a Nonuniform Energy Gap in the Base Region," *Solid-State Electronic*, 28(11):1101-1103 (1985).

Maziar, C. M., et al., "On the Estimation of Base Transit Time in AlGaAs/GaAs Bipolar Transistors," *IEEE Electron Device Lett.* 8: 90-91 (1987).

Stockman, S. A., et al., "Growth of carbon-doped p-type $InxGa1-xAs$ ($0<x\leq0.53$) by metalorganic chemical vapor deposition," *Appl. Phys. Lett* 60(23):2903-2905 (1992).

\* cited by examiner

| |
|---|
| 500 Å Si-doped $In_{0.6}Ga_{0.4}As$ ($1 \times 10^{19}$ $cm^{-3}$) |
| 500 Å Si-doped InGaAs Grade ($1 \times 10^{19}$ $cm^{-3}$) |
| 1500 Å Si-doped GaAs ($5 \times 10^{18}$ $cm^{-3}$) |
| 500 Å Si-doped InGaP or AlGaAs ($4 \times 10^{17}$ $cm^{-3}$) |
| 450 Å C-doped GaAs ($4 \times 10^{19}$ $cm^{-3}$) |
| 150 Å C-doped GaAs ($2 \times 10^{19}$ $cm^{-3}$) |
| 5000 Å Si-doped GaAs ($1 \times 10^{16}$ $cm^{-3}$) |
| 5000 Å Si-doped GaAs ($5 \times 10^{18}$ $cm^{-3}$) |
| GaAs SUBSTRATE |

FIG. 8

| 500 Å Si-doped $In_{0.6}Ga_{0.4}As$ ($1 \times 10^{19}$ cm$^{-3}$) |
|---|
| 500 Å Si-doped InGaAs Grade ($1 \times 10^{19}$ cm$^{-3}$) |
| 1500 Å Si-doped GaAs ($5 \times 10^{18}$ cm$^{-3}$) |
| 500 Å Si-doped InGaP ($4 \times 10^{17}$ cm$^{-3}$) |
| 50 Å transitional layer |
| 450 Å C-doped $Ga_{1-x}In_xAs_{1-y}N_y$ ($4 \times 10^{19}$ cm$^{-3}$) 25 mV compositional grade |
| 150 Å C-doped $Ga_{1-x}In_xAs_{1-y}N_y$ ($4 \times 10^{19}$ cm$^{-3}$) 25 mV compositional grade |
| 50 Å transitional layer |
| 5000 Å Si-doped GaAs ($1 \times 10^{16}$ cm$^{-3}$) |
| 5000 Å Si-doped GaAs ($5 \times 10^{18}$ cm$^{-3}$) |
| GaAs SUBSTRATE |

FIG. 11

BIPOLAR TRANSISTOR WITH ENHANCED BASE TRANSPORT

BACKGROUND OF THE INVENTION

GaAs-based heterojunction bipolar transistors (HBTs) employing heavily p-doped material (e.g. about $4\times10^{19}$ cm$^{-3}$) in the base layer have developed into a key device technology utilized in a variety of commercial and military applications, particularly as power amplifiers for wireless handsets (see, for example, U.S. Pat. No. 6,750,480, U.S. Patent Application Publication No. 2002/0163014, and International Application Publication Nos. WO 02/043155 and WO 03/088363, the entire teachings of which are incorporated herein by reference). The physical properties of the base layer fundamentally control many of the key DC and RF device characteristics. One of the most critical properties is the base transit time ($\tau_{b,tr}$). The base transit time directly limits the peak DC current gain, or beta ($\beta$), of HBTs, which in the limit of neutral base recombination can be expressed as:

$$\beta_{nbr} \cong v_b \tau_{rec}/w_b = \tau_{rec}/\tau_{b,tr} \qquad (1)$$

where $v_b$ is the average minority carrier velocity across the base, $\tau_{rec}$ is the minority carrier lifetime in the base, and $w_b$ is the base thickness. Base transit time also directly impacts bipolar transistor RF properties. The cutoff frequency $f_t$ is well known to be inversely related to the sum of the transit and charging times:

$$1/2\pi f_t = \tau_{b,tr} + \tau_{cscl} + (\tau_e + \tau_c) \qquad (2)$$

where $\tau_{cscl}$ is the collector transit time, and $\tau_e$, $\tau_c$ are the emitter and collector charging times. The expected maximum frequency of operation ($f_{max}$) is related to both $f_t$ and the base resistance ($R_b$) which is, in turn, related to the base sheet resistance ($R_{sb}$):

$$f_{max} = (f_t/8\pi R_b C_{bc})^{1/2} \qquad (3)$$

where $C_{bc}$ is the base-collector capacitance. The power gain of a bipolar transistor circuit is directly related to $f_{max}$ and $\beta$. Equations (1)-(3) clearly illustrate the benefit of reducing base transit time. The collector current density ($J_c$) of a bipolar transistor can also be enhanced via a decrease in the base transit time:

$$J_c = q n_{avg} v_{avg} = q n_{avg} w_b / \tau_{b,tr} \qquad (4)$$

where $n_{avg}$ is the average carrier concentration in the base layer.

Therefore, reducing the base transit time, especially if accomplished without degrading other device properties such as $R_{sb}$, is of great benefit to enhancing the performance of bipolar transistor devices and circuits. Consequently, further improvements in the fabrication of semiconductor materials of bipolar transistors would reduce the base transit time without degrading $R_{sb}$, and thereby improve the performance of the devices.

SUMMARY OF THE INVENTION

In one embodiment, the present invention is directed to a bipolar transistor that includes an n-doped collector, a p-doped base formed over the collector and an n-doped emitter formed over the base. The base of the transistor has a first region that is adjacent to the collector and a second region that is adjacent to the emitter, where the average p-dopant concentration of the second region is higher than the average p-dopant concentration of the first region.

Alternatively, the base of the transistor has a graded band gap, where the grade of the base band gap is greater in the first region that is adjacent to the collector than in the second region that is adjacent to the emitter, and the average band gap of the first region is lower than that of the second region.

In a preferred embodiment, the bipolar transistor of the invention includes a base having a graded band gap and a non-uniform p-dopant concentration throughout the base. In this embodiment, the transistor has a greater grade of the base band gap in a first region adjacent to the collector than a grade of the base band gap in a second region adjacent to the emitter, where the average band gap of the first region is lower than that of the second region, and has a higher average p-dopant concentration in the second region than in the first region.

In another embodiment, the present invention is directed to a method of fabricating a bipolar transistor, where a base layer is non-uniformly p-doped. The method comprises the steps of: growing an n-doped collector layer; growing a first region of a p-doped base layer over the collector layer; growing a second region of the p-doped base layer over the first region, where the average p-dopant concentration of the second region is higher than the average p-dopant concentration of the first region; and growing an n-doped emitter layer over the base layer. The p-dopant concentration can be controlled by employing intrinsic and/or extrinsic p-dopant sources. The use of both intrinsic and extrinsic sources can help form a material with a relatively high p-dopant concentration.

In yet another embodiment, the present invention is directed to a method of fabricating a bipolar transistor having a base layer that has a non-linearly graded band gap. The method includes the steps of: growing an n-doped collector layer; growing the base layer by flowing suitable source of materials, such as organometallic compounds, over a surface of the collector layer, depositing atoms that are components of the base layer, e.g., atoms of Group III-V of the Periodic Table; and growing an n-doped emitter, where the second region is adjacent to the emitter. A flow rate of each of the source materials, e.g., organometallic compounds, changes during deposition to thereby form the non-linear grade of band gap throughout the base layer, such that the grade of band gap in a first region that is adjacent to the collector is greater than the grade of band gap in a second region, where the average band gap of the first region is lower than that of the second region. Preferably, while the base layer is being grown, the base layer maintains high p-type doping levels by the use of intrinsic and/or extrinsic p-dopant sources. The p-type doping levels can be essentially uniform across the base layer. Alternatively, the p-type doping levels can be non-uniform, such that the average p-dopant concentration of the first region is lower than the average p-dopant concentration of the second region.

The present invention also provides a p-doped semiconductor material comprising a Group III-V material, which can be used in a semiconductor device, such as a bipolar transistor. The p-doped semiconductor material has a first region and a second region. The average p-dopant concentration of the first region is lower than the average p-dopant concentration of the second region. Also, the band gap of the semiconductor material is non-linearly graded, such that a grade in the first region is higher than a grade in the second region, where the average band gap of the first region is lower than that of the second region.

It is believed that built-in fields impart energy to minority carriers as they transverse the base layer, which in turn, reduce base transit time in bipolar transistors. Therefore, a bipolar transistor of the invention, which utilizes built-in

BRIEF DESCRIPTION OF THE DRAWINGS

FIG. 8 is a schematic diagram of a GaAs HBT of the invention, employing a built-in field near the base-collector junction.

FIG. 11 is a schematic diagram of a GaInAsN HBT of the invention, employing a built-in field focused on a base region near the base-collector junction.

DETAILED DESCRIPTION OF THE INVENTION

Figure 1:
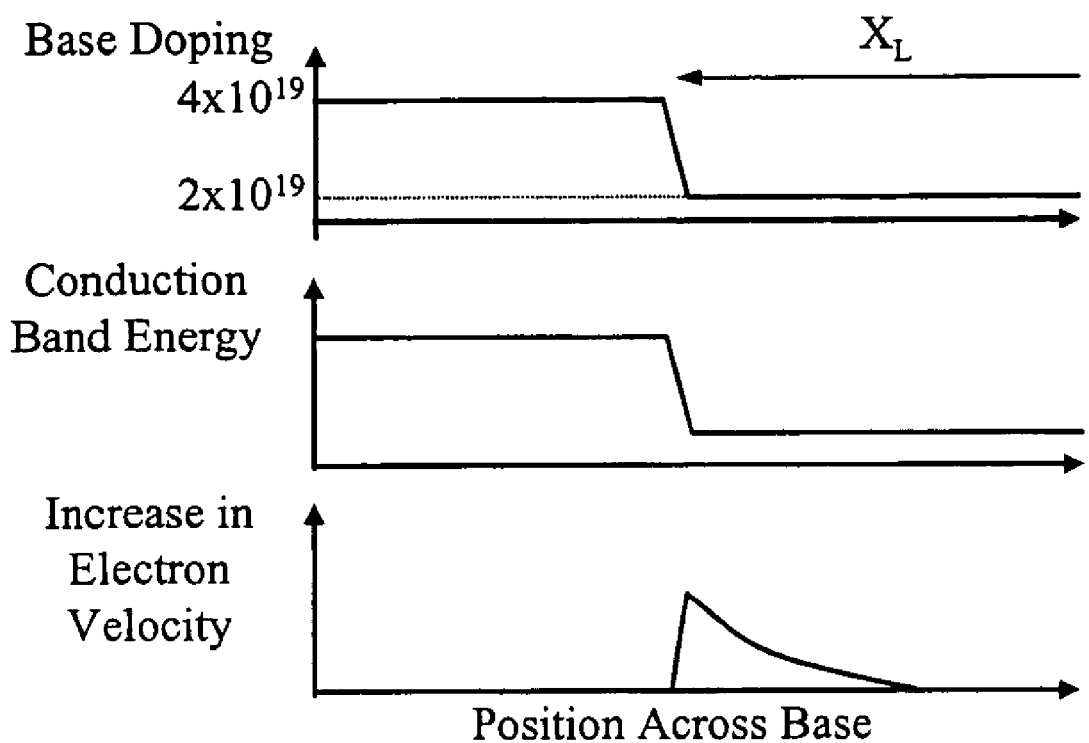
FIG. 1 shows a profile of an embodiment of the invention, across the base from an emitter to a collector of doping, and also shows conduction band energy and increase in velocity due to doping change.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

It has been found that base transport by minority carriers is retarded proximate to a base-collector junction in several technologically important material systems (see Example 1). This phenomenon is contrary to prevailing industry wisdom that the velocity increases towards the collector. It also has been found that the presence of a built-in field over a small region of the base next to the collector greatly enhances base transport (see Examples 3 and 4).

In particular, the present invention is directed to a bipolar transistor having a structure with a built-in field focused on a base region where minority carriers would otherwise travel slowest. The built-in field can be formed by including non-uniform p-dopant concentration throughout the base, employing a base having a non-linearly graded band gap, or incorporating both techniques. With these techniques, a relatively large accelerating field is built into a portion of base region adjacent to a collector layer. Although not to be held to any particular theory, it is believed that, for example, reducing the p-dopant (a positive hole) concentration of a base region proximate to a collector can allow the velocity of minority carriers (electrons) in the region increases. A method for fabricating a bipolar transistor and a p-doped semiconductor material for use in a semiconductor device of the invention, such as a bipolar transistor, are also provided.

In the present invention, the base layer can comprise any suitable semiconductor material having a lower band gap than the band gap of GaAs. Preferably, the base is composed of a non-strain relaxed material. More preferably, the base layer includes a Group III-V semiconductor material, even more preferably gallium and arsenic. Examples of the base material include GaAs, AlGaAs, GaInAs, GaAsSb, GaInAsN, GaAsSbN, GaInAsSb and GaInAsSbN.

In a preferred embodiment, the invention is a heterojunction bipolar transistor (HBT), where the collector material is GaAs or InGaP, and the emitter material is InGaP, AlInGaP or AlGaAs. In a more preferred embodiment, the invention is a double heterojunction bipolar transistor (DHBT).

Preferably, when the collector is GaAs or InGaP, and the emitter is InGaP, AlInGaP or AlGaAs, the base material includes gallium, arsenic, indium and nitrogen. In a specific example, the base material is represented by the formula of $Ga_{1-x}In_xAs_{1-y}N_y$ wherein x and y are each, independently, about $1.0\times10^{-4}$ to about $2.0\times10^{-1}$. Preferably, x is about 3y.

In one embodiment, the present invention employs a base that is non-uniformly doped, such that a first base region that is adjacent to the collector layer has a lower average p-dopant concentration than does a second base region adjacent to the emitter layer. This base structure causes a relatively large accelerating field to be built into the first base region. Preferably, the doping concentration of the second region is greater than $1.0\times10^{19}$ cm$^{-3}$. In particular, the base layer has high doping concentrations in both the first and second base regions, for example, each in a range of between about $1.0\times10^{19}$ cm$^{-3}$ and about $7\times10^{19}$ cm$^{-3}$.

The high doping concentration can be achieved by the use of intrinsic and extrinsic p-dopant sources, as described in U.S. Pat. No. 6,750,480, the entire teachings of which are incorporated herein by reference. Herein, the terms "intrinsic" and "extrinsic" may be used interchangeably with terms "internal" and "external," respectively. Typically, a higher dopant concentration in a material reduces the sheet resistivity and band gap of the material. Thus, generally the higher the dopant concentration in the base layer of a bipolar transistor, such as an HBT or a DHBT (double heterojunction bipolar transistor), the lower the turn-on voltage of the device. Preferably, the p-dopant is carbon. Examples of an extrinsic carbon source include carbon tetrahalide, such as carbon tetrabromide or carbon tetrachloride.

Non-uniform doping can be performed in a stepwise, linear grading, or non-linear grading fashion. In a preferred embodiment, the p-dopant concentration in the first region is graded. A graded profile can minimize increase in base sheet resistance. In a more preferred embodiment, a doping grade in the first region is higher than that in the second region.

The first region, having a lower doping level, is relatively thin (e.g., a few hundred angstroms or less). Thus, the thickness of the first region corresponds to a small fraction of the total base thickness, preferably about ⅕ of the total base thickness, thereby minimizing an undesired increase in $R_{sb}$.

In a specific example, the thickness of the first region is less than 300 Å, in particular, is in a range of between about 50 Å and about 300 Å. Herein the thickness of the first region is measured from a first surface contiguous with the collector to a second surface contiguous with the second region of the base.

In another embodiment, the present invention employs a non-linearly graded base, where an accelerating field is built within the base by decreasing the energy-gap of the base material in a base region adjacent to the collector layer. Although the energy gap of the base diminishes proximate to the collector layer, the rate of the reduction in energy gap is highest in the first region, adjacent to the collector. This base structure causes a relatively large accelerating field to be built into the first base region. The thickness of the first region is relatively thin, having a thickness of, for example, a few hundred angstroms or less. Preferably, the thickness of the first region is less than 300 Å, in particular, in a range of between about 50 Å and about 300 Å.

A base layer having a non-linearly graded band gap can be formed by flowing suitable source of materials, such as organometallic compounds, over a surface of the collector layer, depositing atoms that are components of the base, for example, atoms of Group III-V of the Periodic Table. A flow rate of each of the source materials changes during deposition to thereby form a non-linear grade of band gap throughout the base layer, such that the grade of band gap in a first region, adjacent to the collector, is greater than the grade of band gap in a second region, where the average band gap of the first region is lower than that of the second region. For example, a GaInAsN base layer can be grown using a gallium source, an arsenic source, an indium source and a nitrogen source, as described below for general steps for fabricating a heterojunction bipolar transistor.

Layers of the HBTs of the invention generally can be formed by conventional methods. For example, methods of forming base layers that include graded band gaps are known to those skilled in the art and can be found, for example, in Patent Application Publication No. 2002/0163014, the entire teachings of which are incorporated by reference herein.

In a preferred embodiment, the band gap of the base layer is lower at a surface of the base layer that is in contact with the collector than at a surface of the base layer that is in contact with the emitter. The base layer band gap is generally at least about 5 meV lower at a surface of the base layer proximate to the collector than at a surface of the base layer proximate to the emitter. In other embodiments, the base layer band gap is at least about 20 meV lower at a surface of the base layer proximate to the collector than at a surface of the base layer proximate to the emitter. In still further embodiments, the base layer band gap is at least about 100 meV lower at a surface of the base layer proximate to the collector than at a surface of the base layer proximate to the emitter. In still further embodiments, the base layer band gap is at least about 300 meV lower at a surface of the base layer proximate to the collector than at a surface of the base layer proximate to the emitter. Preferably, the band gap of the base layer is lower at a surface of the base layer that is in contact with the collector than at a surface of the base layer that is in contact with the emitter by an amount in a range of between about 5 meV and about 150 meV.

In general, the average band gap of the base in the HBT's of the present invention is at least about 5 meV less than the band gap of GaAs, and is typically between about 5 meV and about 600 meV less than the band gap of GaAs. In some embodiments, the average band gap of the base is at least about 80 meV less than the band gap of GaAs material. In still further embodiments, the average band gap of the base is at least about 180 meV less than the band gap of GaAs material. Preferably, the base layer has an average band gap reduction in a range of between about 5 meV and about 450 meV, more preferably between about 10 meV and about 200 meV, less than the band gap of GaAs.

Preferably, the base layer of this embodiment has high doping concentrations in both first and second base regions. In a specific example, the doping concentration of the second region is greater than $1.0 \times 10^{19}$ $cm^{-3}$. In another specific example, the doping concentration of each region may be in a range of between about $1.0 \times 10^{19}$ $cm^{-3}$ and about $7 \times 10^{19}$ $cm^{-3}$. Maintaining high p-type doping levels while growing a compositionally-graded base that has a graded band gap across the base layer can be done by carefully controlling the flow rates of dopant sources, as described in, for example, Patent Application Publication No. 2002/0163014.

The doping concentration can be uniform, e.g., constant across the entire base layer. Alternatively, an average doping concentration can be lower in the first region than in the second region, whereby an additional accelerating field is built into the second region. Preferably, the base having a lower average doping concentration in the first region than in the second region includes an average doping concentration of greater than $1.0 \times 10^{19}$ $cm^{-3}$ in the second region. The doping concentration in the first region is preferably graded. More preferably, a doping grade in the first region is higher than a doping grade in the second region. The high doping concentration can be achieved by the use of intrinsic and extrinsic p-dopant sources, as described above.

Preferably, the p-dopant is carbon. Examples of an extrinsic carbon source are as described above.

In another embodiment, the present invention is a bipolar transistor that includes a base layer that has a lower average p-dopant concentration in the first region than in the second region, and that has a graded band gap, where the grade of the base band gap is greater in the first region than the grade of the base band gap in the second region, and the average band gap of the first region is lower than that of the second region. Other features of the base layer of this embodiment are as described above.

The base layer of this embodiment can be formed as described above. For example, the base layer that includes a Group III-V material can be formed by flowing organometallic compounds over a surface of the collector layer, depositing atoms of Group III-V of the Periodic Table. A flow rate of each of the organometallic compounds changes during deposition to thereby form a non-linear graded band gap throughout the base layer, such that the grade of band gap in the first region is greater than the grade of band gap in the second region. The p-dopant concentration also is controlled by changing the flow rates of the organometallic compounds. When the base is heavily doped, an extrinsic p-dopant source can also be used simultaneously with an intrinsic source from the organometallic compounds. Preferably, the p-dopant is carbon. Examples of an extrinsic carbon source are as described above.

Optionally, a bipolar transistor of the invention can further include one or more transitional layers and/or one or more lattice-matched layers. In a specific example, the transistor of the invention described above includes a first transitional layer disposed between the base and the collector, having a first surface contiguous with the first surface of the first region of the base. The transistor can further include a second transitional layer having a first surface contiguous with a first surface of the emitter and a second surface contiguous with a surface of the second region of the base. In another specific example, a bipolar transistor of the invention includes first and second transitional layers, as described above, and a lattice-matched layer. The lattice-matched layer has a first surface contiguous with a first surface of the collector and a second surface contiguous with a second surface of the first transitional layer, where the lattice matched layer is a wide-band-gap material.

The term "transitional layer," as used herein, refers to a layer that is between the base/emitter heterojunction or the base/collector heterojunction and has the function of reducing or minimizing the conduction band spike of the heterojunction. One embodiment that can reduce or minimize a conduction band spike includes a series of transitional layers wherein the band gaps of the transitional layers gradually decrease from the transitional layer nearest in proximity to the collector to the transitional layer nearest in proximity to the base in a base/collector heterojunction. Likewise, in an emitter/base heterojunction, the band gaps of the transitional layers gradually decrease from the transitional layer nearest in proximity to the emitter to the transitional layer nearest in proximity to the base. Another method of minimizing the conduction band spike is to use a transitional layer having a graded band gap. The band gap of a transitional layer can be graded by grading the dopant concentration of the layer. For example, the dopant concentration of the transitional layer can be higher near the base layer and can be gradually decreased near the collector or the emitter. Alternatively, lattice strain can be used to provide a transitional layer having a graded band gap. For example, the transitional layer can be compositionally graded to minimize the lattice strain at the surface of the layer in contact with the base and increase the lattice strain at the surface in contact with the collector or emitter. Another method of minimizing the conduction band spike is to use a transitional layer having a spike in the dopant concentration. One or more of the above-described methods for reducing or minimizing the conduction band spike can be used in the invention. Suitable transitional layers for the HBTs of the invention include InP, InGaP, AlInGaP, GaAs, InGaAs and InGaAsN.

A "lattice-matched layer," as that term is employed herein, is a layer which is grown on a material having a different lattice constant. The lattice-matched layer typically has a thickness of about 500 Å or less and essentially conforms to the lattice constant of the underlying layer. This results in a band gap intermediate between the band gap of the underlying layer and the band gap of the lattice-matched material if it were not strained. Methods of forming lattice-matched layers are known to those skilled in the art and can be found, for example, on pages 303-328 of Ferry, et al., *Gallium Arsenide Technology* (1985), Howard W. Sams & Co., Inc. Indianapolis, Ind., the entire teachings of which are incorporated herein by reference. Preferably, a material for the lattice-matched layer is a wide band-gap material such as InGaP or AlGaAs.

The HBTs and DHBTs of the invention can be prepared using a suitable metalorganic chemical vapor deposition (MOCVD) epitaxial growth system. Examples of suitable MOCVD epitaxial growth systems are AIXTRON 2400® and AIXTRON 2600® production platforms. In the HBTs and the DHBTs prepared by the method of the invention, typically, an un-doped GaAs buffer layer can be grown after in-situ oxide desorption. For example, a subcollector layer containing a high concentration of an n-dopant (e.g., dopant concentration about $1\times10^{18}$ cm$^{-3}$ to about $9\times10^{18}$ cm$^{-3}$) can be grown at a temperature of about 700° C. A collector layer with a low concentration of an n-dopant (e.g., dopant concentration about $5\times10^{15}$ cm$^{-3}$ to about $5\times10^{16}$ cm$^{-3}$) can be grown over the subcollector at a temperature of about 700° C.

Preferably, the subcollector and the collector are GaAs. The subcollector layer typically has a thickness of about 4000 Å to about 6000 Å, and the collector typically has a thickness of about 3000 Å to about 5000 Å. In one embodiment, the dopant in the subcollector and/or the collector is silicon.

Optionally, a lattice-matched InGaP tunnel layer can be grown over the collector under typical growth conditions. A lattice-matched layer generally has a thickness of about 500 Å or less, preferably about 200 Å or less, and has a dopant concentration of about $1\times10^{16}$ cm$^{-3}$ to about $1\times10^{18}$ cm$^{-3}$.

One or more transitional layers can optionally be grown under typical growth conditions on the lattice-matched layer or on the collector if no lattice-matched layer is employed. Transitional layer can be prepared from n-doped GaAs, InGaAs, InGaAsN, InP, InGaP or AlInGaP. Transitional layers optionally can be compositionally or dopant graded or can contain a dopant spike. Transitional layers typically have a thickness in a range of between about 75 Å and about 25 Å. When neither a lattice-matched nor a transitional layer is employed, the p-doped base layer, e.g., GaInAsN base layer, is grown over the collector by the method of the invention, as described above, The base layer is grown at a temperature below about 750° C. and typically is about 400 Å to about 1500 Å thick. In a preferred embodiment, the base layer is grown at a temperature of about 500° C. to about 600° C. Optionally, the carbon doped GaInAsN base layer can be grown over the transitional layer or over the lattice-matched layer if a transitional layer is not used. The base layer can be grown using a suitable source of materials. For example, a GaInAsN base layer can be grown using a gallium source, such as trimethylgallium or triethylgallium, an arsenic source, such as arsine, tributylarsine or trimethylarsine, an indium source, such as trimethylindium, and a nitrogen source, such as ammonia or dimethylhydrazine. A low molar ratio of an arsenic source to a gallium source is preferred. Typically, the molar ratio of the arsenic source to the gallium source is less than about 3.5. More preferably, the ratio is in a range of between about 2.0 and about 3.0. The flow rates of the nitrogen and indium sources can be adjusted to obtain a material which is composed of, for example, about 0.01% to about 20% indium and about 0.01% to about 20% nitrogen. In a preferred embodiment, the indium content of the base layer is about three times higher than the nitrogen content. For a base layer having a non-linearly graded band gap, the amounts of the Group III and V elements are varied from the base-collector junction to the base-emitter junction, such that a higher grade can be achieved at a region closer to the collector than a grade at a region close to the emitter.

As described above, a GaInAsN layer having a high carbon dopant concentration, for example, of about $1.0\times10^{19}$ cm$^{-3}$ to about $7.0\times10^{19}$ cm$^{-3}$ can be obtained by using an extrinsic carbon source and an intrinsic organometallic source, specifically, the gallium source. In general, the intrinsic sources, such as organogallium compounds and organoindium compounds, contribute different amounts of carbon dopant to the GaInAsN base layer, respectively. Thus, the carbon dopant source gas flow typically is adjusted during the growth of the base layer so as to obtain a desired carbon doping concentration. An example of a suitable extrinsic carbon source is carbon tetrabromide. Carbon tetrachloride is also an effective extrinsic carbon source.

Optionally, one or more transitional layers of n-doped GaAs, n-doped InGaAs or n-doped InGaAsN can be grown between the base and the emitter. Transitional layers between the base and emitter are relatively lightly doped (e.g., about $5.0 \times 10^{15}$ cm$^{-3}$ to about $5.0 \times 10^{16}$ cm$^{-3}$) and optionally contain a dopant spike. Preferably, transitional layers are about 25 Å to about 75 Å thick.

In one embodiment, an emitter layer is grown over the base, or optionally over a transitional layer, at a temperature of about 700° C. and is typically about 400 Å to about 1500 Å thick. The emitter layer includes, for example, InGaP, AlInGaP, or AlGaAs. In a preferred embodiment, the emitter layer includes InGaP. The emitter layer can be n-doped at a concentration of about, for example, $1.0 \times 10^{17}$ cm$^{-3}$ to about $9.0 \times 10^{17}$ cm$^{-3}$. An emitter-contact layer that includes GaAs containing a high concentration of an n-dopant (e.g., about $1.0 \times 10^{18}$ cm$^{-3}$ to about $9 \times 10^{18}$ cm$^{-3}$) optionally is grown over the emitter at a temperature of about 700° C. Typically, the emitter contact layer is about 1000 Å to about 2000 Å thick.

An InGaAs layer with a ramped-in indium composition and a high concentration of an n-dopant (e.g., about $5 \times 10^{18}$ cm$^{-3}$ to about $5 \times 10^{19}$ cm$^{-3}$) is grown over the emitter contact layer. This layer typically is about 400 Å to about 1000 Å thick.

The base layer designs described above can also be combined with alternative designs for the emitter and collector, including but not limited to: (1) multi-layer collectors; (2) a collector tunnel layer between the base and the collector; (3) field effect transistor (FET)/bipolar transistor combinations; and (4) emitters that incorporate ballast layers.

In order to improve the amplifier efficiency and thus lower the operating voltage and extend the battery lifetime, it is desirable to reduce the offset voltage ($V_{CE,sat}$) and the knee voltage ($V_k$). One method of lowering the offset voltage is to minimize the asymmetry in turn-on voltages of the base/emitter and base/collector diode pair. DHBTs having wide band gap collectors have been shown to yield low $V_{CE,sat}$ values, but in practice this leads to a higher $V_k$ and reduces efficiencies because it is difficult to control the potential barrier at the base/collector heterojunction.

One embodiment that can allow $V_{CE,sat}$ and $V_k$ to be simultaneously reduced, improving the efficiency of the device includes a thin layer having a high band gap (a tunneling collector), which is inserted between the base and the collector. Examples for a DHBT employing such a tunneling collector can be found, for example, in WO 03/088363 and U.S. patent application Ser. No. 10/969,804 entitled BIPOLAR TRANSISTOR WITH GRADED BASE LAYER, by Roger E. Welser et al., filed on Oct. 20, 2004, the entire teachings of which are incorporated herein by reference.

The following examples are not intended to be limited in any way.

EXEMPLIFICATION

Example 1

Retarded Base Transport Near the Base-Collector Junction

A single stepwise doping change in the base of a GaAs npn heterojunction bipolar transistor (HBT) was employed to locally accelerate the electrons. The increase in minority carrier velocity leads to an increase in the beta (β) of large area transistors. The beta (β) of large area transistors was used as a probe of local minority carrier velocity across the base. The largest increase in average velocity (15%) occurred when positioned about 200 Å from the collector, suggesting that the electron velocity was actually lower, not higher, close to the collector in GaAs HBTs.

Modern GaAs transistors generally have a base layer doped with carbon to a level of $4 \times 10^{19}$ cm$^{-3}$ and a thickness of 500 Å to 1500 Å. Earlier theoretical and experimental works suggest that the transport across this base is quasiballistic, falling in between the limits of purely ballistic and diffusive theory. The velocity profile of electrons across the base has been projected by Monte Carlo simulations to increase across the base layer, reaching a maximum ($v_{MAX}$) near the collector close to the thermal velocity of GaAs ($2.1 \times 10^7$ cm/s).

However, it was found that the transit time ($\tau_{tr}$) across the base of GaAs HBTs could be modeled with a finite exit velocity approximation if a much lower $v_{MAX}$ was used, and in this limit:

$$\tau_{tr} = \frac{w^2}{2D} + \frac{w}{v_{MAX}} \quad (5)$$

where w was the base thickness, D was the diffusion coefficient of the minority electrons in the heavily doped base, and $v_{MAX}$ was the maximum velocity of electrons exiting the base.

The base velocity profile of GaAs HBTs was probed by growing two series of structures with a step doping reduction, with the lower doped section adjacent to the collector. This doping change produced a field that accelerated electrons toward the collector and a net energy determined by the doping change. This is schematically drawn in FIG. 1. The velocity profile of electrons in the base was then examined by moving the position of this doping change. The lower doped region ($2.0 \times 10^{19}$ cm$^{-3}$ vs. $4.0 \times 10^{19}$ cm$^{-3}$) had a thickness up to 300 Å and was adjacent to the collector. The total base thickness was 600 Å or 1000 Å for the two sample sets.

Changes in the average electron velocity across the base layer had been estimated based upon changes in the beta of large area devices. In the limit of neutral base recombination which was typically seen in GaAs HBTs, β could be related to the average electron velocity as shown previously in Equation 1. The recombination lifetime is well known to vary inversely with C-doping in modern GaAs HBTs, and can be quantified as a function of base doping for each sample set investigated. Average electron velocity across the base could then be calculated using Equation 1. It was noted that the base transit time was inversely related to the average electron velocity via the base thickness, as described in Equation 1.

Figure 2:
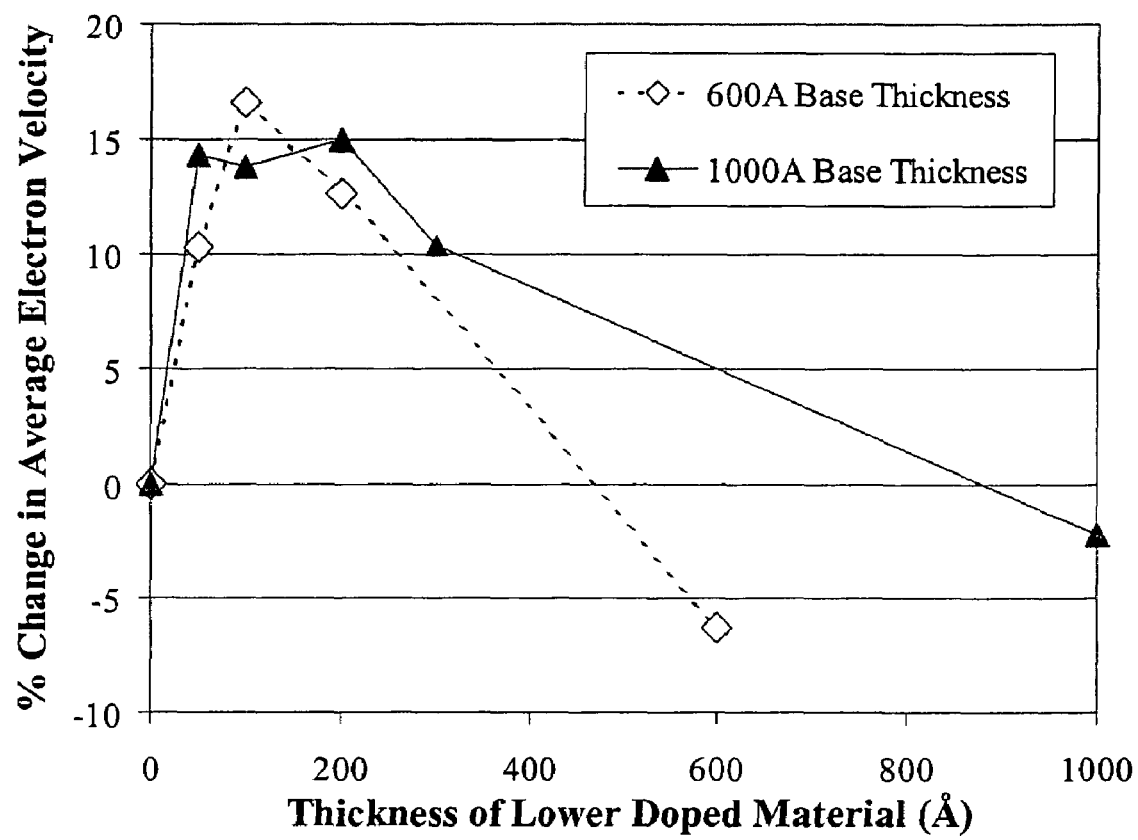
FIG. 2 is a graph of an embodiment of the invention, showing an impact of stepwise changes in the doping level (from $4.0\times10^{19}$ cm$^{-3}$ to $2.0\times10^{19}$ cm$^{-3}$) on the base transport across a GaAs base layer.

The minority carrier velocity reflected in β was greatly improved with the reduction in base doping adjacent to the collector. FIG. 2 summarizes the change in an average velocity (v) as the position of the stepwise change in doping was moved across the base layer. For both sets of devices having different total base thicknesses (600 Å and 1000 Å), the change in v increased sharply until the doping change was approximately 200 Å from the collector, and then decreased rapidly. The increase in v was very similar for the sample sets having different total base thicknesses. This data indicated that transport across the base of GaAs HBTs was hindered as electrons approached the collector. By inference, it could be concluded that the electron velocity profile across the base layer is higher towards the emitter and lower near the collector, which were in conflict with the generally accepted understanding of base transport in GaAs HBTs.

Figure 3:
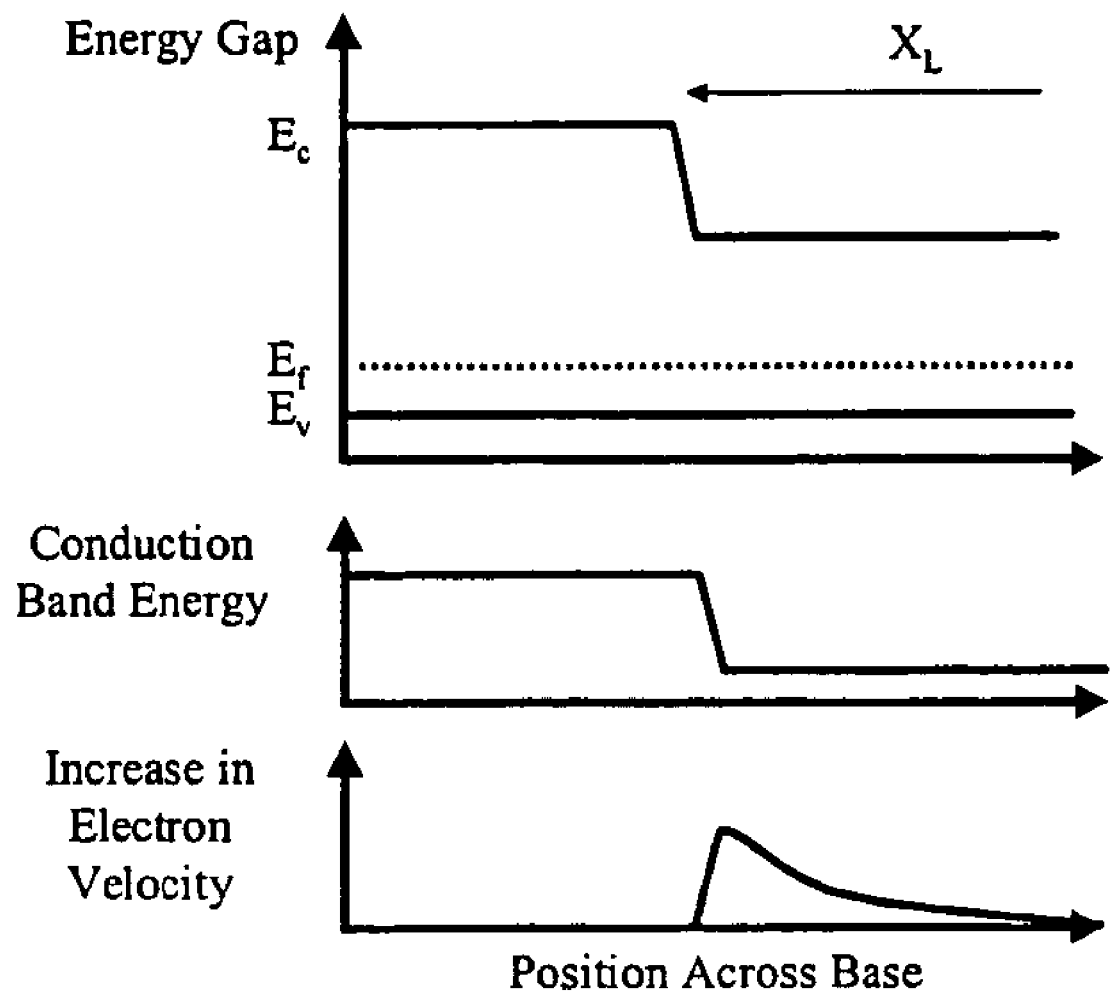
FIG. 3 shows a profile of an embodiment of the invention, across the base from an emitter to a collector of energy gap, and also shows conduction band energy and increase in velocity due to energy gap.
Figure 4:
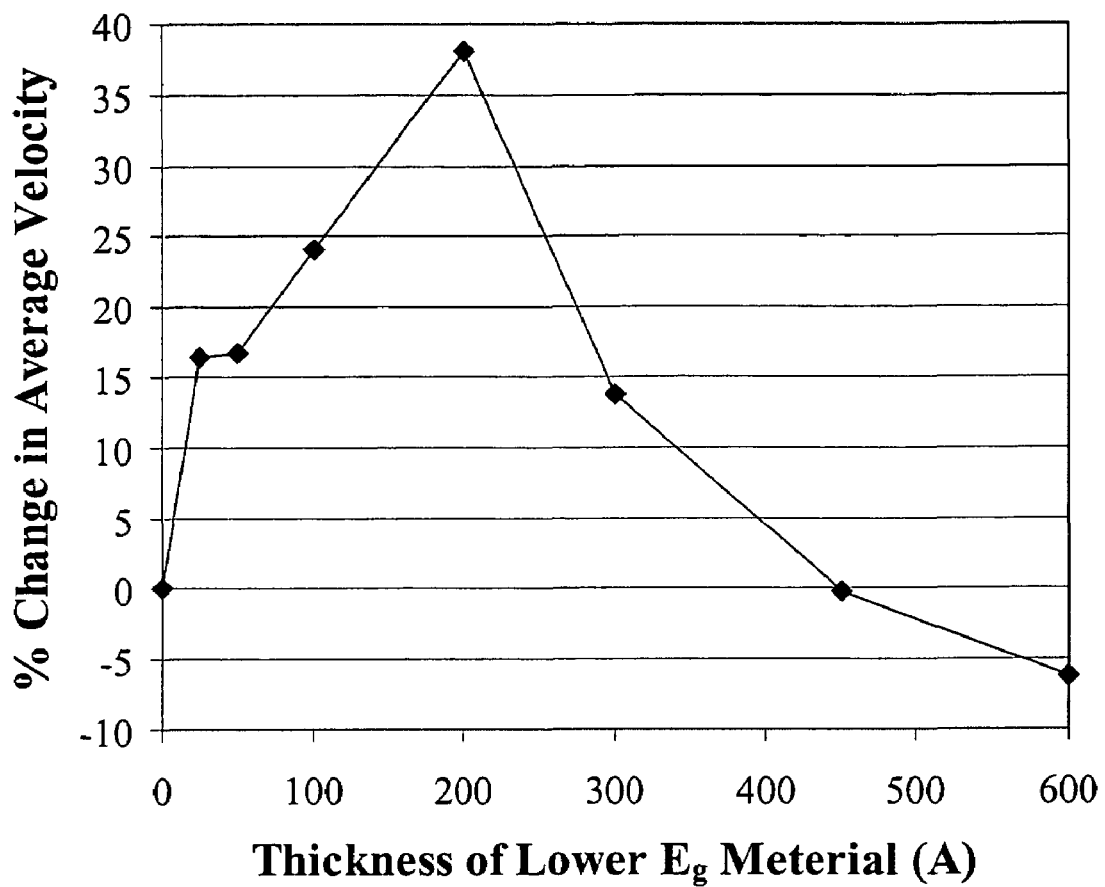
FIG. 4 is a graph of an embodiment of the invention, showing an impact of step changes in the energy gap on the base transport across a GaInAsN base layer.

The same phenomenon was also observed in GaInAsN HBTs (FIGS. 3 and 4). Here a stepwise change in base energy gap was used to locally accelerate the electrons. In FIG. 4, the energy gap change was about 40 meV.

Example 2

Graded Versus Step Function Accelerating Fields

Figure 5:
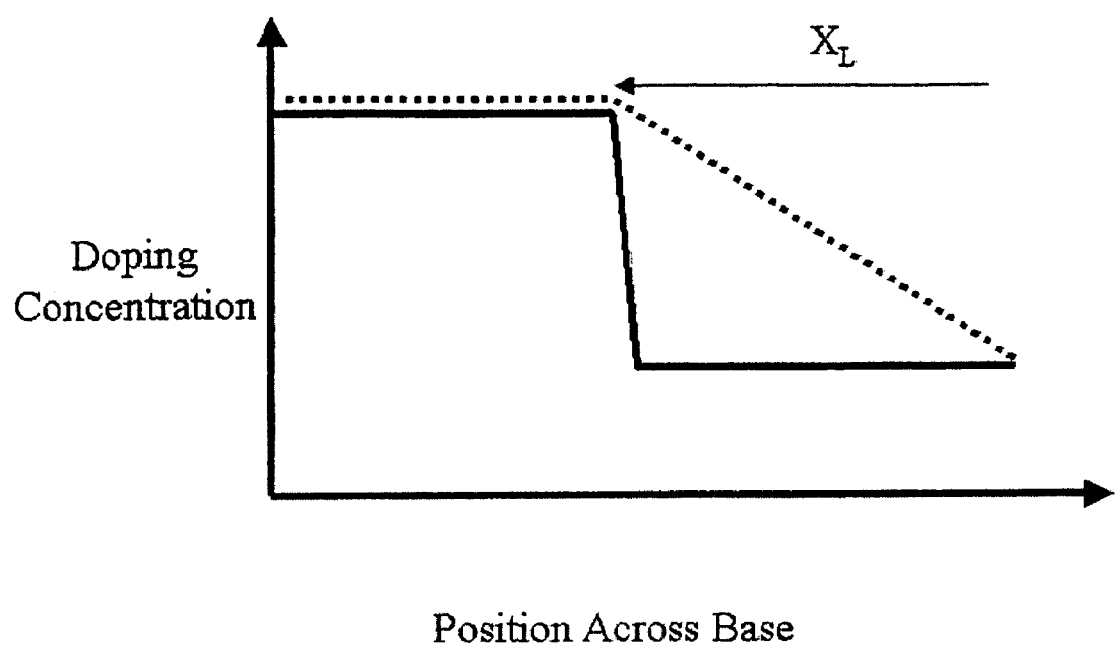
FIG. 5 shows a profile of an embodiment of the invention, across the base from an emitter to a collector of doping level, comparing a stepwise change of the doping level with a gradual change of the doping level.
Figure 6:
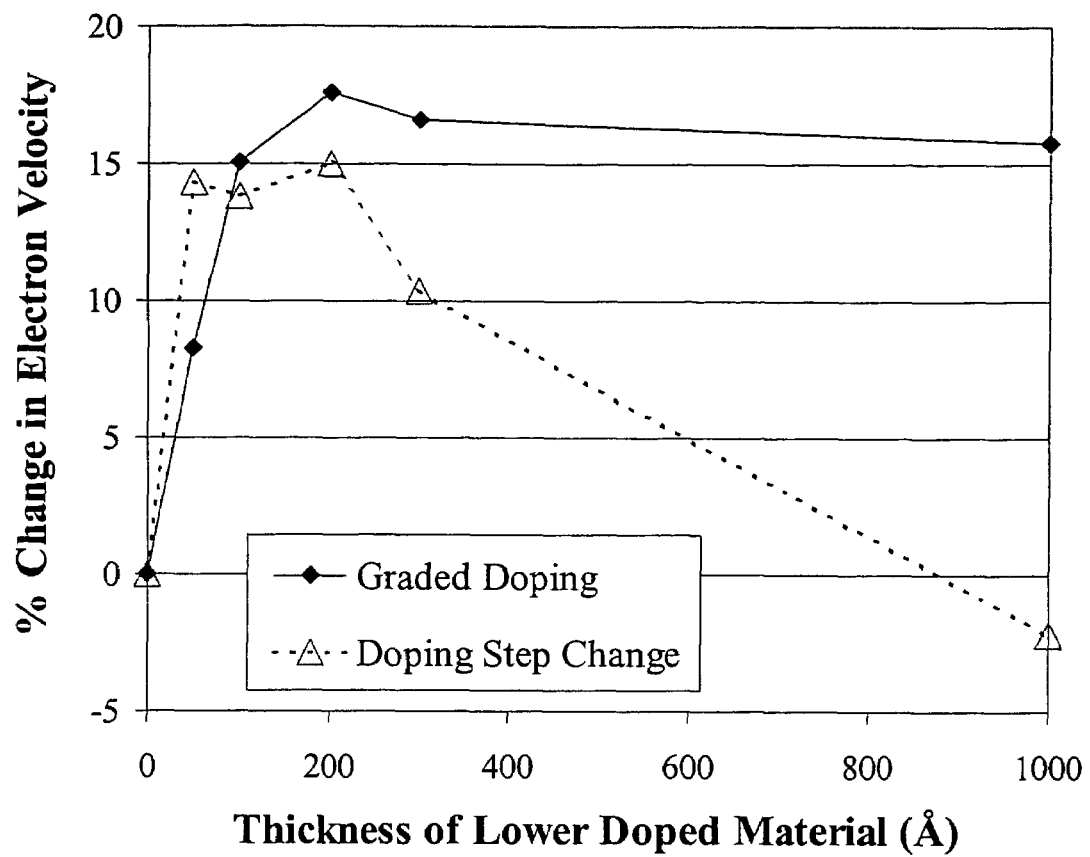
FIG. 6 is a graph of an embodiment of the invention, showing comparison of the impact of stepwise and gradual changes in the base doping on the base transport across a GaAs base layer.
Figure 7:
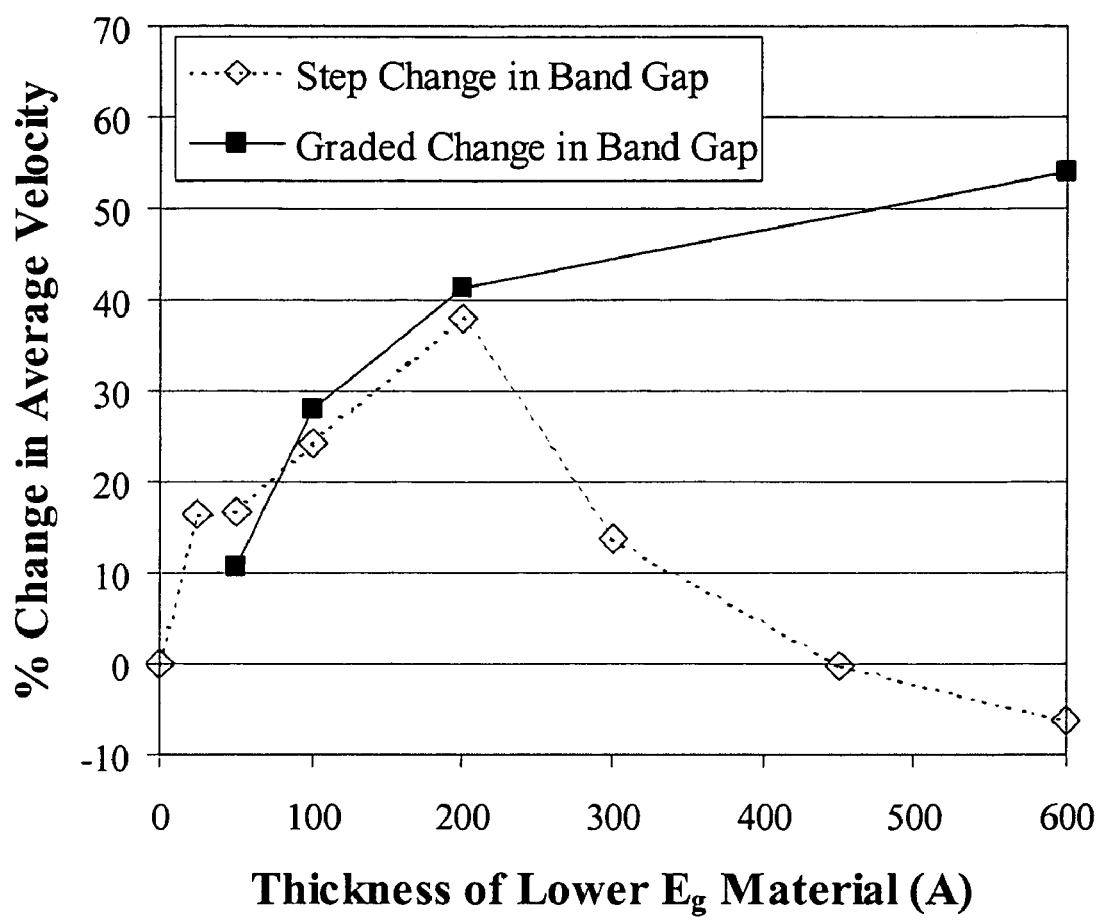
FIG. 7 is a graph of an embodiment of the invention, showing comparison of the impact of step and gradual changes in the base energy gap on the base transport across a GaInAsN base layer.

While stepwise changes in doping and energy-gap were employed to study the minority carrier velocity profile across the base layer of GaAs and GaInAsN bipolar transistors, grading the doping and energy-gap was found to be just as effective at increasing the average electron velocity (FIGS. 5 through 7).

Grading is generally preferred in both cases to step change designs. In the case of doping, the graded profile minimized the increase in base sheet resistance. In the case of energy gap, the graded profile minimized strain.

Example 3

GaAs HBT with Base Doping Grade Adjacent to the Collector

FIG. 8 shows a schematic diagram of one preferred embodiment of this invention. The specific values of the doping levels were not critically important. The carrier acceleration was related to the doping range. A wider range provided more carrier acceleration, but resulted in a larger increase in $R_{sb}$. This tradeoff, typical of base doping, needed to be optimized for each particular application. The net effect was a 15% increase in average velocity (a 15% decrease in average transit time) across the base, while $R_{sb}$ was increased only by 2%. Simultaneous optimization of $f_t$ and $f_{max}$ can provide improved freedom for additional optimization.

Example 4

Graded GaInAsN HBT with High Field Adjacent to the Collector

Figure 9:
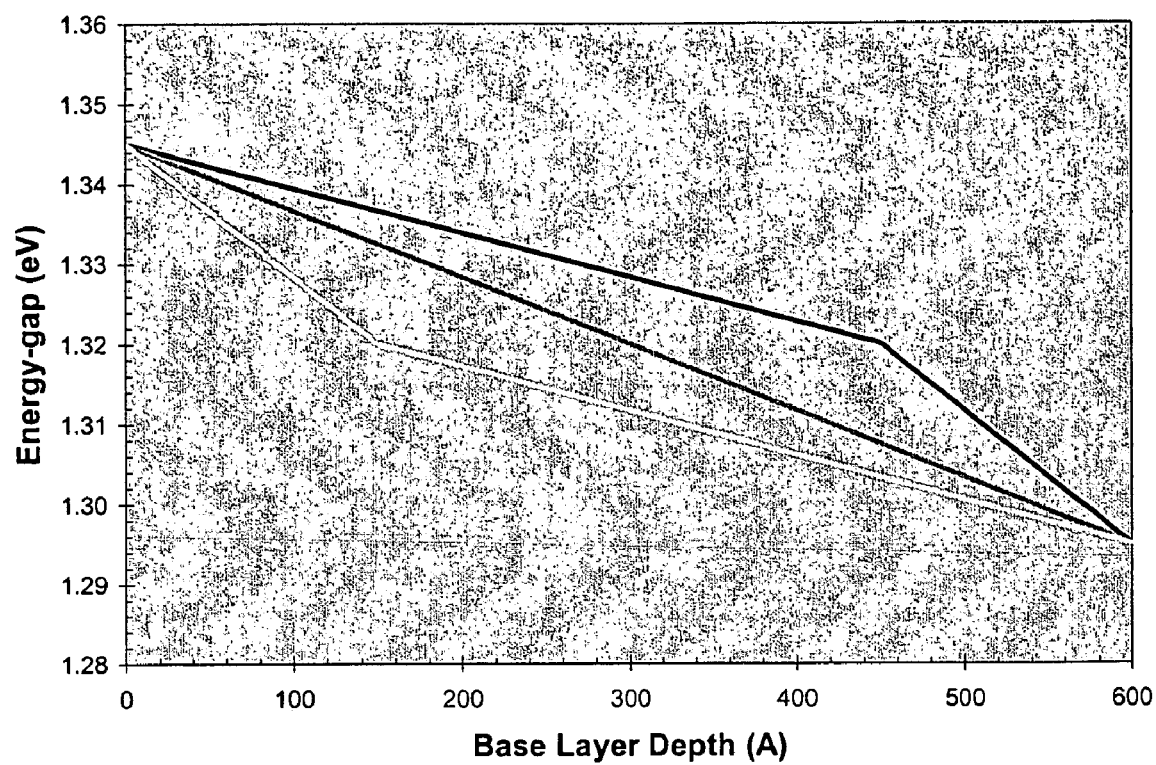
FIG. 9 is a graph of an embodiment of the invention, showing profile comparison of the energy gap across the base from emitter to collector for three different structures.
Figure 10:
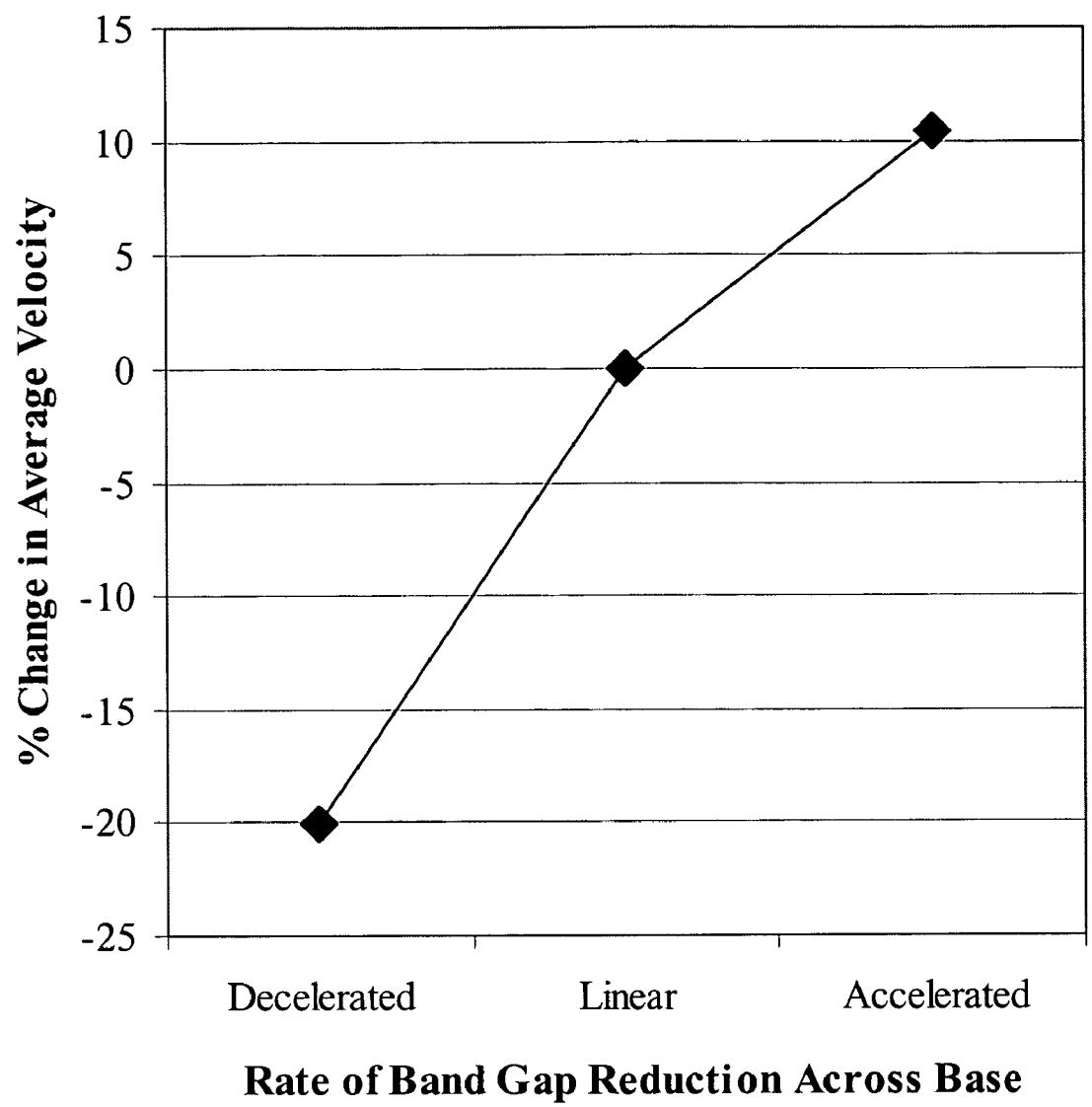
FIG. 10 is a graph of an embodiment of the invention, showing relative increase in electron velocity of the three base layer designs profiled in FIG. 9.

FIGS. 9 and 10 illustrate an example of the benefit of accelerating the grades of the base layer in a thin region close to the collector. In FIG. 9, a white line represents a decelerated energy-gap profile; a gray line represents an energy-gap profile of a linearly-graded base that is previously understood in the art; and a solid black line represents an energy-gap profile of the invention, where the rate of band gap grading is increased adjacent to the collector, referred to as accelerated grading. FIG. 11 shows a schematic diagram of a GaInAsN HBT employing a built-in field focused near the base-collector junction. These data clearly showed the benefits of the invention in optimizing the HBT structure. Higher average velocities were reached with a lower strain in the base. $F_t$ and $f_{max}$ can be further optimized as well as DC parameters such as turn-on voltage, knee voltage, and Early voltage.

EQUIVALENTS

While this invention has been particularly shown and described with references to preferred embodiments thereof, it will be understood by those skilled in the art that various changes in form and details may be made therein without departing from the scope of the invention encompassed by the appended claims.

What is claimed is:

1. A bipolar transistor, comprising:
   (a) an n-doped collector;
   (b) a p-doped base formed over the collector, the base having a first region that is adjacent to the collector and a second region, wherein the average p-dopant concentration of the second region is higher than the average p-dopant concentration of the first region, wherein each of the first and second regions has a p-dopant concentration in a range of between about $1.0 \times 10^{19}$ cm$^{-3}$ and about $7 \times 10^{19}$ cm$^{-3}$, and wherein the p-dopant concentration of the first region is graded with a doping grade higher than a doping grade in the second region; and
   (c) an n-doped emitter formed over the base, wherein said second region is adjacent to the emitter.

2. The transistor of claim 1, wherein the base includes a III-V semiconductor material.

3. The transistor of claim 2, wherein the III-V semiconductor material includes gallium and arsenic, 4. The transistor of claim 3, wherein the base material is selected from the group consisting of GaAs, AlGaAs, GaInAs, GaAsSb. GaAsSbN. GaInAsN, GaInAsSb and GaInAsSbN.

5. The transistor of claim 4, wherein the collector is selected from the group consisting of GaAs and InGaP, and the emitter is selected from the group consisting of InGaP, AlInGaP and AlGaAs, and wherein the transistor is a heterojunction bipolar transistor.

6. The transistor of claim 5, wherein the III-V semiconductor material for the base further includes indium and nitrogen.

7. The transistor of claim 6, wherein the thickness of the first region is less than 300 Å, the thickness being measured from a first surface contiguous with the collector to a second surface contiguous with the second region of the base.

8. The transistor of claim 7, wherein the base layer includes a layer of the formula of $Ga_{1-x}In_xAs_{1-y}N_y$, wherein x and y are each, independently, about $1.0 \times 10^{-4}$ to about $2.0 \times 10^{-1}$.

9. The transistor of claim 8, wherein x is about 3y.

10. The transistor of claim 9, further comprising a first transitional layer disposed between the base and the collector, having a first surface contiguous with the first surface of the first region of the base, and wherein the first transitional layer includes an n-doped material selected from the group consisting of InP, InGaP, AlInGaP, GaAs, InGaAs and InGaAsN.

11. The transistor of claim 10, further comprising a second transitional layer having a first surface contiguous with a first surface of the emitter and a second surface contiguous with a surface of the second region of the base, and wherein the second transitional layer includes an n-doped material selected from the group consisting of InP, InGaP, AlInGaP, GaAs. InGaAs and InGaAsN.

12. The transistor of claim 2, wherein the base has a graded band gap, the grade of the band gap being greater in the first region than in the second region.

13. The transistor of claim 12, wherein the III-V semiconductor material includes gallium and arsenic.

14. The transistor of claim 13, wherein the hand gap of the base is lower at a surface of the base that is in contact with the collector than at a surface of the base layer that is in contact with the emitter by an amount in a range of between about 5 meV and about 150 meV.

15. The transistor of claim 14, wherein the base layer has an average band gap reduction in a range of between about 5 meV and about 450 meV less than the band gap of GaAs.

16. The transistor of claim 15, wherein the base material is selected from the group consisting of AlGaAs, GaInAs, GaAsSb, GaAsSbN, GaInAsN, GaInAsSb and GaInAsSbN.

17. The transistor of claim 16, wherein the collector is selected from the group consisting of GaAs and InGaP and the emitter is selected from the group consisting of InGaP. AlInGaP and AlGaAs. and wherein the transistor is a heterojunction bipolar transistor.

18. The transistor of claim 17, wherein the III-V semiconductor material includes gallium, arsenic, indium and nitrogen.

19. The transistor of claim 18, wherein the thickness of the first region is less than 300 Å, the thickness being measured from a first surface contiguous with the collector to a second surface contiguous with the second region.

20. A bipolar transistor, comprising:
(a) an n-doped collector;
(b) a p-doped base formed over the collector, wherein the base has a graded band gap, the grade of the base band gap being greater in a first region that is adjacent to the collector than in a second region, and wherein the average band gap of the first region is lower than the average band gap of the second region, wherein each of the first and second regions has a p-doping concentration in a range of between about $1.0 \times 10^{19}$ cm$^{-3}$ and about $7 \times 10^{19}$ cm$^{-3}$, where a thickness of the first region is less or equal to 25% of a total thickness of the base, and wherein a doping grade in the first region is higher than a doping grade in the second region; and
(c) an n-doped emitter formed over the base, wherein said second region is adjacent to the emitter.

21. The transistor of claim 20, wherein the base includes a III-V semiconductor material.

22. The transistor of claim 21, wherein the III-V semiconductor material includes gallium and arsenic.

23. The transistor of claim 22, wherein the band gap of the base is lower at a surface of the base that is in contact with the collector than at a surface of the base layer that is in contact with the emitter by an amount in a range of between about 5 meV and about 150 meV.

24. The transistor of claim 23, wherein the base layer has an average band gap reduction in a range of between about 5 meV and about 450 meV less than the band gap of GaAs.

25. The transistor of claim 24, wherein the base material is selected from the group consisting of AlGaAs, GaInAs, GaAsSb. GaAsSbN, GaInAsN, GaInAsSb and GaInAsSbN.

26. The transistor of claim 25, wherein the collector is selected from the group consisting of GaAs and InGaP, and the emitter is selected from the group consisting of InGaP, AlInGaP and AlGaAs, and wherein the transistor is a heterojunction bipolar transistor.

27. The transistor of claim 26, wherein the base material includes gallium, arsenic, indium and nitrogen.

28. The transistor of claim 27, wherein the thickness of the first region is less than 300 Å, the thickness being measured from a first surface contiguous with the collector to a second surface contiguous with the second region.

29. The transistor of claim 28, wherein the base layer includes a layer of the formula of $Ga_{1-x}In_xAs_{1-y}N_y$, wherein x and y are each, independently, about $1.0 \times 10^{-4}$ to about $2.0 \times 10^{-1}$.

30. The transistor of claim 29, wherein x is about 3y.

31. The transistor of claim 30, wherein the average p-dopant concentration of the second region is higher than the average p-dopant concentration of the first region.

32. The transistor of claim 31, wherein the p-dopant concentration in the first region is graded.

33. The transistor of claim 20, further comprising a first transitional layer disposed between the base and the collector, having a first surface contiguous with the first surface of the first region of the base, and wherein the first transitional layer includes an n-doped material selected from the group consisting of InP, InGaP, AlInGaP, GaAs, InGaAs and InGaAsN.

34. The transistor of claim 33, further comprising a second transitional layer having a first surface contiguous with a first surface of the emitter and a second surface contiguous with a surface of the second region of the base, and wherein the second transitional layer includes an n-doped material selected from the group consisting of InP, InGaP, AlInGaP, GaAs, InGaAs and InGaAsN.

* * * * *

UNITED STATES PATENT AND TRADEMARK OFFICE
CERTIFICATE OF CORRECTION

PATENT NO. : 7,566,948 B2  Page 1 of 1
APPLICATION NO. : 10/969762
DATED : July 28, 2009
INVENTOR(S) : Rehder et al.

It is certified that error appears in the above-identified patent and that said Letters Patent is hereby corrected as shown below:

Column 12, Line 16, delete "," and insert --.--

Column 12, Line 19, delete "GaAsSb. GaAsSbN." and insert --GaAsSb, GaAsSbN,--

Column 12, Line 24, delete "AIinGaP" and insert --AlInGaP--

Column 12, Line 48, delete "GaAs." and insert --GaAs,--

Column 12, Line 54, delete "hand" and insert --band--

Column 13, Line 1, delete "InGaP." and insert --InGaP,--

Column 13, Line 2, delete "AlGaAs." and insert --AlGaAs,--

Column 14, Line 3, delete "GaAsSb." and insert --GaAsSb,--

Signed and Sealed this

Twenty-second Day of December, 2009

David J. Kappos
*Director of the United States Patent and Trademark Office*